(12) United States Patent
Ryan et al.

(10) Patent No.: US 6,198,420 B1
(45) Date of Patent: Mar. 6, 2001

(54) MULTIPLE LEVEL QUANTIZER

(75) Inventors: John G. Ryan, Cork; John A. Keane, Co. Cork, both of (IE); Rudolf G. van Ettinger, West Lothian (GB)

(73) Assignee: Silicon Systems Research Limited, Dublin (IE)

( * ) Notice: Subject to any disclaimer, the term of this patent is extended or adjusted under 35 U.S.C. 154(b) by 0 days.

(21) Appl. No.: 09/211,722

(22) Filed: Dec. 14, 1998

(51) Int. Cl.$^7$ ....................................................... H03M 1/12
(52) U.S. Cl. ............................................. 341/155; 341/159
(58) Field of Search .................................. 341/155, 154, 341/159, 161

(56) References Cited

U.S. PATENT DOCUMENTS

| | | |
|---|---|---|
| 3,736,582 | 5/1973 | Norris . |
| 3,883,222 | 5/1975 | Gunderson . |
| 4,237,387 * | 12/1980 | Devendorf et al. .................. 307/203 |
| 4,431,916 | 2/1984 | Couch . |
| 5,041,832 * | 8/1991 | Gulczynski ........................... 341/159 |
| 5,142,244 * | 8/1992 | Glica et al. ........................... 330/253 |
| 5,381,052 | 1/1995 | Kolte . |
| 5,877,718 * | 3/1999 | Andoh et al. ......................... 341/155 |

OTHER PUBLICATIONS

Yin, G. M., et al, "A High–Speed CMOS Comparator with 8–b Resoluation", *I.E.E.E. Journal of Solid–State Circuits*, Feb. 1992, vol. 27, No. 2.

Mangelsdorf, C. W., "A 400–MHz Input Flash Converter with Error Correction", *I.E.E.E. Journal of Solid–State Circuits*, Feb. 1990, vol. 25, No. 1.

Nakamura, M., "An Instantaneous Response CMOS Optical Receiver IC with Wide Dynamic Range and Extremely High Sensitivity Using Feed–Forward Auto–Bias Adjustment", *I.E.E.E. Journal of Solid–State Circuits*, Sep. 1995, vol. 30, No. 9.

Klaassen, K.B., et al, "Read/Write Amplifier Design Considerations for MR Heads", *I.E.E.E. Transactions of Magnetics*, Mar. 1995, vol. 31, No. 2.

\* cited by examiner

*Primary Examiner*—Peguy JeanPierre
(74) *Attorney, Agent, or Firm*—Richard K. Robinson

(57) ABSTRACT

A DC coupled serial data stream receiver system utilizing a switched capacitor based differencing front end which compares the instantaneous value of an analog voltage with respect to its long term minimum value to a series of reference voltages $V_1$ to $V_n$ in a flash analog to digital converter style front end. The circuit is designed to interface directly to a discrete fiberoptic preamplifier. The receiver can handle multiple amplitude serial data as produced by multiple fiberoptic transmitters on the same fiber without any data loss and without any interruption in data transfer being necessary as one transmitter halts and a second one starts transmission.

28 Claims, 8 Drawing Sheets

MULTIPLE LEVEL QUANTIZER

BACKGROUND OF THE INVENTION

The present invention relates to analogue tracking amplifiers, especially such as peak/valley detectors used in digital data receivers such as fiberoptic receivers. It also relates to flash analog to digital converters.

In a fiberoptic network, information is transferred as pulses of light across fiberoptic cable links. Optical networks typically include transfer points called "mixers" or "couplers" which accept signals from one fiberoptic link and transfer that signal to another link. Because practically all computers and data processing devices use electrical signals to operate, most origin and destination points in fiberoptic networks include converters that either detect optical signals and then produce electrical pulses, or detect electrical pulses and generate corresponding optical signals on the optical network. Converters located at destination points usually consist of a photodetector, a preamplifier and a data detection circuit.

Fiberoptic receivers typically comprise an optical preamplifier which takes the incident optical data and converts it to a voltage waveform whose amplitude is proportional to the intensity of the light pulses. The intensity of the light pulses tends to be poorly defined as it depends on the location and optical performance of the transmitter or transmitters. Typically multiple transmitters, each of which will transmit during different time intervals, are present. Furthermore, the voltage level at the output of the optical preamplifier, which corresponds to a dark signal or absence of an incident light pulse, is often very poorly defined and varies widely from preamplifier to preamplifier. It, however, tends to be relatively stable for any one optical preamplifier, except for temperature variations and component aging effects. The characteristics of the output signal of an optical preamplifier will have relatively time invariant dark (or signal zero) levels and varying amplitude pulses (corresponding to different active transmitters) which are superimposed on this dark level.

A second element of a fiberoptic receiver system takes the analog output of the preamplifier and recovers both clock and data information from the analog waveform. The first element of this clock and data recovery system is a comparator whose trigger level is set at approximately fifty percent (50%) ofthe amplitude of the signal. The comparator slices the signal into logic ones and logic zeros. The comparator evaluates the signal at a sample rate equal to or at some multiple of the data rate. When a sample rate of a multiple of the data rate is used, the signal is said to be oversampled and, in this case, it is not necessary for the clock to have a known phase relationship with the incoming data.

Consequently, because of the unknown dark level and the characteristics of the output signal, the data from the optical preamplifier has some characteristics that make subsequent processing of the signal difficult. FIG. 1 illustrates a waveform 11 of a received stream of logic zeros 13 and logic ones 15 with five different signal amplitudes, TX1, TX2, TX3, TX4 and TX5 all sharing a common dark level 17. The different signal amplitudes correspond to five different transmitters on a fiberoptic network. The switch over from one transmitter to another is usually accomplished within one bit period. This means that the receiver circuitry must quickly sense the change and respond to a second output signal such as a TX2 having a logic one represented by a signal with a different amplitude from the previous signal, TX1.

A second difficulty is that the DC average value of the signal varies with each transmitter and so it is impossible to use AC or capacitor coupling of the signal to establish an average value that can be used with a comparator to decide which level represents a logic zero and which level represents a logic one.

FIG. 2 illustrate the above point showing the effect of AC coupling on a multi-amplitude data stream. FIG. 2A includes a signal waveform 27 from the optical preamplifier and shows peak 23 which corresponds to the logic ones while valley 21 corresponds to logic zeros. FIG. 2B illustrates the effects of capacitance coupling. The waveform 27 now floats on a DC average signal represented by dash line 25 and consequently the peak 23 and valley 21 no longer correspond to logic zeros or logic ones (reference should be made to point 28). It should be noted that when the data amplitude changes, the average of the data pulses is lost for a period related to the time constant of the AC coupling system.

The presence of multiple amplitude signals in the data requires the use of multiple comparators or an analog to digital converter whose bit weighting is sufficiently small so as to adequately slice the smallest amplitude signal and whose full scale voltage is sufficiently large so as to adequately slice the largest signal amplitude at approximately their respective fifty percent (50%) values. In practice, the above requirements place severe restrictions on the analog to digital converter's resolution and speed. For example, in a 5V system, the dark level signal from a different optical preamplifier varies from 0.5V to 4.0V and the signal amplitude varies from 50 mV to 0.5V. The bit rate is typically in excess of 100 Mhz. An analog to digital converter that can cover this range would need a bit weighting of 25 mV and a measurement range from 0.5V to 4.25V implying a resolution in excess of 6 bits at a minimum of 100 Mhz conversion rate.

In U.S. Pat. No. 4,431,916 to Couch, Couch uses a signal delaying circuit to create threshold signals and detects the peak of a first delayed signal between the one-half rise point in the input signal and a one-half fall point in a second delayed signal.

Devices exist for detecting a predetermined voltage level and for using the detected voltage level to offset a circuit. U.S. Pat. No. 3,736,582 to Norris discloses a compensation circuit that adjusts a baseline voltage up and down in a system where that baseline voltage "gallops" or changes.

U.S. Pat. No. 5,381,052 issued to Kolte discusses a device which detects and tracks a peak level through a network of operational amplifiers and a capacitor which holds the peak voltage value. Kolte's device inverts a detected input voltage and drives the capacitor in two different states, depending on the polarity of the voltage between input and the inverter. In a first state, the capacitor follows the input voltage, while in a second state, the capacitor value is the average of the input voltage and the inverter voltage.

SUMMARY OF THE INVENTION

The present invention addresses the above problems by providing a dark level regeneration circuit that is fully integrated into an analog to digital converter front end. The analog to digital converter zero level, or reference level, is set to the dark level and hence the effective conversion range of the analog to digital converter is restricted to half of the maximum expected signal amplitude. In the above example, the resolution is now reduced to between 2 and 3 bits, thus, substantially reducing the complexity, power consumption and cost of the analog to digital converter. A further advantage of the invention is that the reference voltage of the analog to digital converter can be referenced to ground (or any other convenient voltage) and does not have to track the DC component of the signal. This advantage provides additional circuit simplification.

The present invention provides an analog to digital signal converter which has a signal input, a reference potential input, and a dark detector for providing a normalized reference signal. The digital signal converter possesses a threshold voltage generator connected to the reference potential input which produces at least one threshold voltage.

The analog to digital signal converter also has a system of preamps and regenerative comparators which compare a signal with respect to its dark level to a threshold voltage which is defined as a difference of two voltages.

The threshold voltage generator can generate a plurality of reference signals. In addition, the system of comparators and latches include a plurality of comparators for toggling between a comparison state and an autozero state, and a plurality of regenerative comparators for holding the comparator outputs for a clock cycle. Oversampling of a received signal is achieved through the use of multiple latches and multi-phase clock.

BRIEF DESCRIPTION OF THE DRAWINGS

The invention will be better understood and its numerous objects and advantages will become more apparent to those skilled in the art by referencing the following drawings, in conjunction with the accompanying specification, in which.

DETAILED DESCRIPTION OF THE EMBODIMENTS

Figure 1:
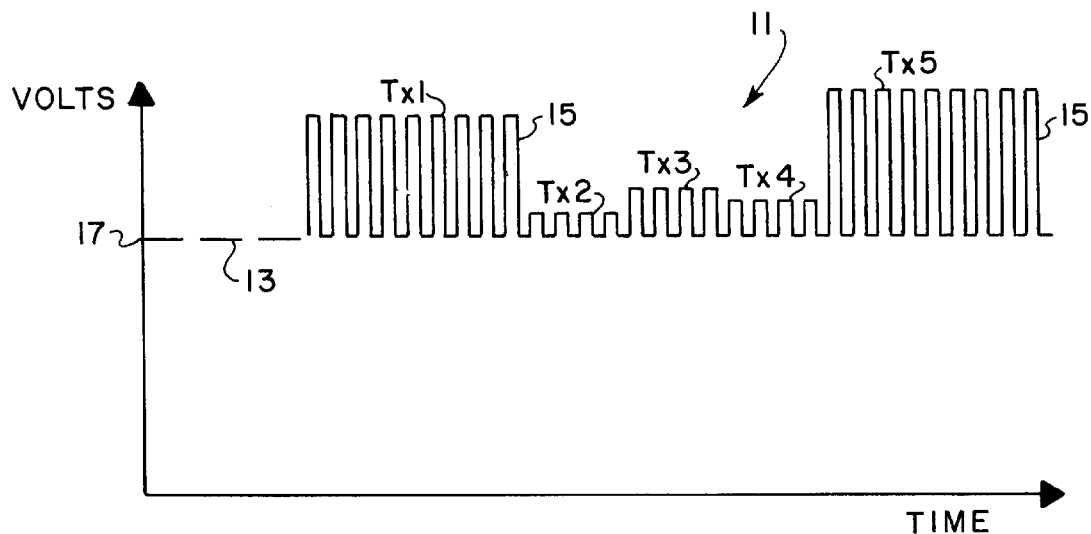
FIGS. 1 and 2 are waveform diagrams illustrating the advantages of the invention.
Figure 2A:
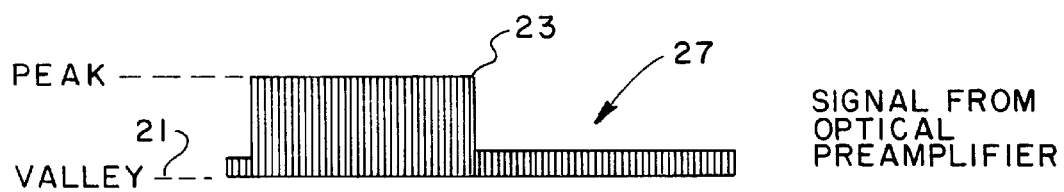
Figure 2B:
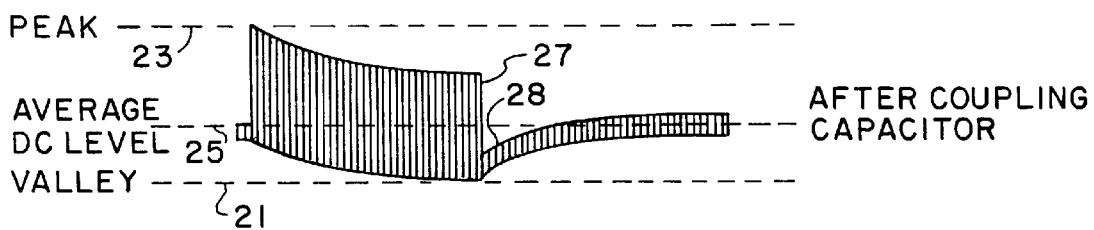
Figure 3:
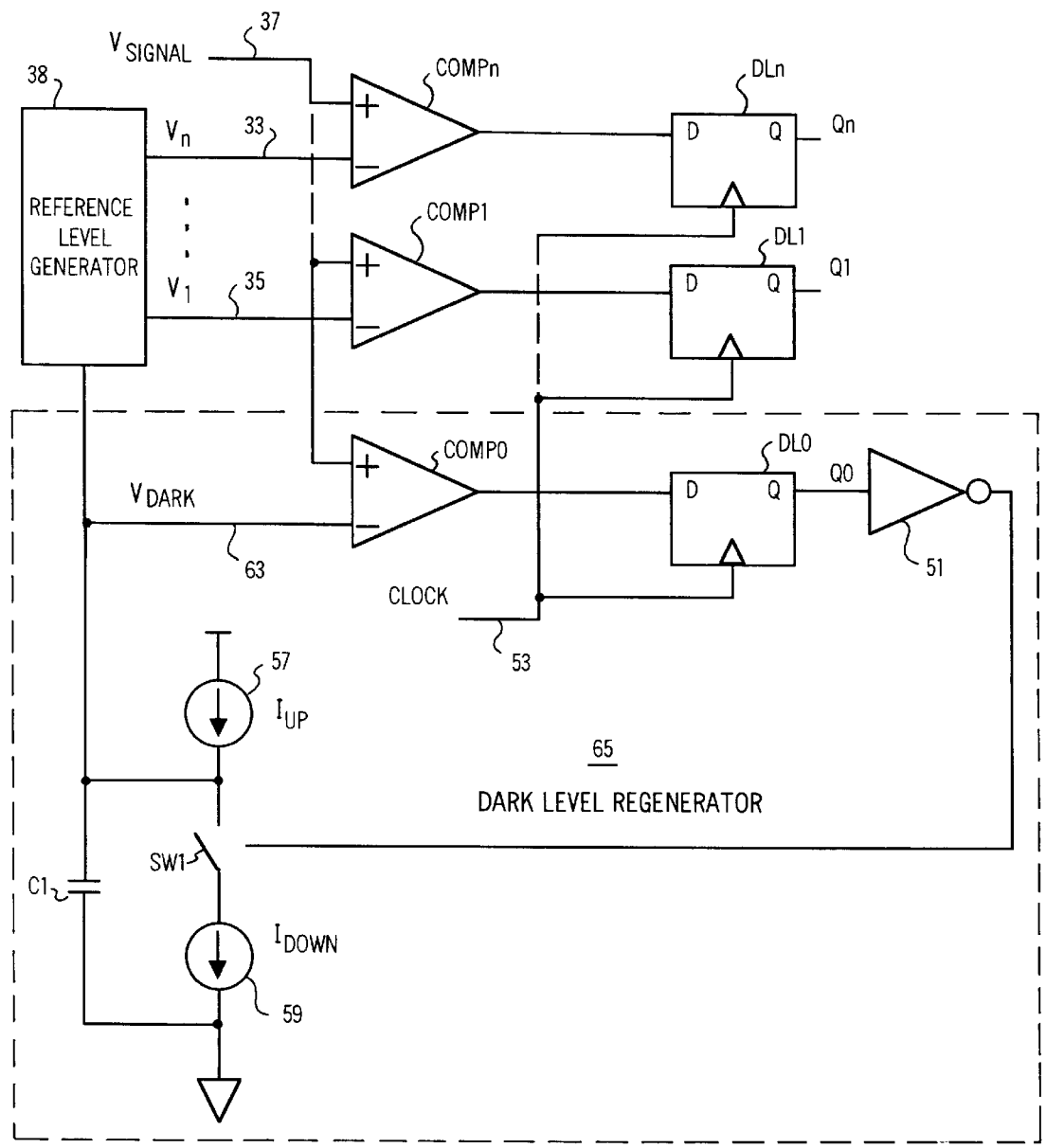
FIG. 3 is an illustrative block diagram of the invention.

FIG. 3 is an illustrative embodiment of a high speed analog to digital converter or flash analog to digital converter 10 according to the invention. $V_{SIGNAL}$ is the incoming analogue signal on conductor 37 from an optical preamplifier, not shown. Reference level generator 38 generates reference voltages $V_1$ to $V_n$ (where "n" is a positive number that represents the number of voltage levels plus 1) and are used as the trigger levels for comparators COMP1 to COMPn (where COMPn represents the total number of comparators in the circuit plus 1) and are applied thereto via conductors 35 and 33 respectively. $V_1$ to $V_n$ are set up to be referenced to a signal called $V_{DARK}$ on conductor 63. In the case of the disclosed embodiment, $V_1$ is about 25 mV in excess of $V_{DARK}$ and $V_n$ is about 250 mV in excess of $V_{DARK}$. There is no restriction on the number of stages represented by "n" or on the scaling of the steps between $V_1$ and $V_n$. One conventional scaling scheme is clearly a linear scaling. The zero comparator COMP0 is used as part of the dark level regeneration circuitry.

The outputs of each comparator are latched by latches DL0 to DLn (where "n" is a positive number representing the number of latches plus 1) under the control of the clock 53. The frequency of the clock is assumed to be at a minimum equal to the bit rate of the incoming bit stream on $V_{SIGNAL}$. Outputs Q1 to Qn are provided to subsequent circuitry for processing in either a conventional flash analog to digital converter back end or in some other way.

The operation of the analog to digital converter is as follows. First, assume that the signal $V_{DARK}$ (conductor 63) is an accurate representation of the dark level in the input $V_{SIGNAL}$ (conductor 37). Comparators COMP1 to COMPn will continuously indicate the state of $V_{SIGNAL}$ with respect to the threshold levels $V_1$ to $V_n$. The zero comparator COMP0 output should be high continuously indicating that the input signal is always in excess of the dark level voltage, $V_{DARK}$. There may be some noise generated by toggling of the output as $V_{SIGNAL}$ comes close to $V_{DARK}$. Under control of the clock (conductor 53), the state of comparators COMP0 to COMPn is latched into latches DL0 to DLn which provide Qn to Q1 as an output. Qn to Q1 may be applied to a decoder to indicate a logic one or applied as a bite of data to a digital processor 70 of FIG. 4 for processing.

A dark level regenerator 65 includes two current sources, current source 59 that provides an up current IUP and a current source 59 that provides a down current IDOWN, a capacitor C1 and a switch SW1 and works in the following manner. Current sources 51, 59 and switch SW1 form a charge pump which charges or discharges capacitor C1 under the control of the logic signal that through the operation of inverter 51 is the inverse of the output of latch DL0. The reference level for comparator COMP0, $V_{DARK}$, is stored on capacitor C1. If $V_{DARK}$ is less than the true minimum level in $V_{SIGNAL}$, then the output of latch DL0 will always remain low and hence switch SW1 will remain open. Current IUP, which is typically much smaller than the current IDOWN, slowly charges capacitor C1 and hence $V_{DARK}$ rises. At some point, $V_{DARK}$ will rise above the true minimum level in $V_{SIGNAL}$. Comparator COMP0 will detect this event, and a logic zero will be latched into latch DL0. The change in state of latch DL0 will close switch SW1 thus starting a discharge of capacitor C1 and a consequent reduction in $V_{DARK}$. On the next clock cycle, if $V_{SIGNAL}$ is in excess of $V_{DARK}$, switch SW1 will open and capacitor C1 slowly will charge again. The net result is that capacitor C1 will be charged to a voltage which will be very close to the true dark level of $V_{SIGNAL}$ with small voltage excursions above and below that dark level. The dark level signal is applied to the referenced level generator which floats on the $V_{DARK}$ level.

While the foregoing illustrates the principle of the invention, it will be clear to those skilled in that art that it is very difficult to realize, particularly in CMOS technology. Because comparators COMP0 to COMPn can detect relatively small signals in excess of 100 Mhz and $V_{DARK}$ can have a wide variation in value, the comparators also have to have a very wide common mode range complicating the design task. In reality, many clock recovery systems require that the clock be a significant multiple of the bit rate which results in the sample rate of the system to be several hundred megahertz. The preferred embodiment shown below addresses these problems by using a switched capacitor based differentiating stage at the front end of a clocked comparator arrangement. As mentioned earlier, the implementation of comparators COMP0 to COMPn is difficult given the high speed requirements of a fiberoptic receiver system. Also, depending on the clock and data recovery algorithm that is subsequently used, the clock may have to run at the bit rate or at a multiple of the bit rate. If a significant multiple is required, it is advantageous to use multiphase clocking schemes where multiple phases of the same frequency (phase shifted appropriately) are used to clock multiple comparators or portions of comparators.

FIGS. 4, 5, 6 and 7 illustrate an embodiment of a high speed analog to digital converter that utilizes a two phase clock and is implemented as a multi-level quantizer. It will be clear to those skilled in the art that this approach can be reduced to a single phase or increased to many phases as required. It will also be clear that many aspects of this system can be used in other data recovery or high speed signal analog to digital converters and are not restricted to fiberoptic receiver applications.

Figure 4:
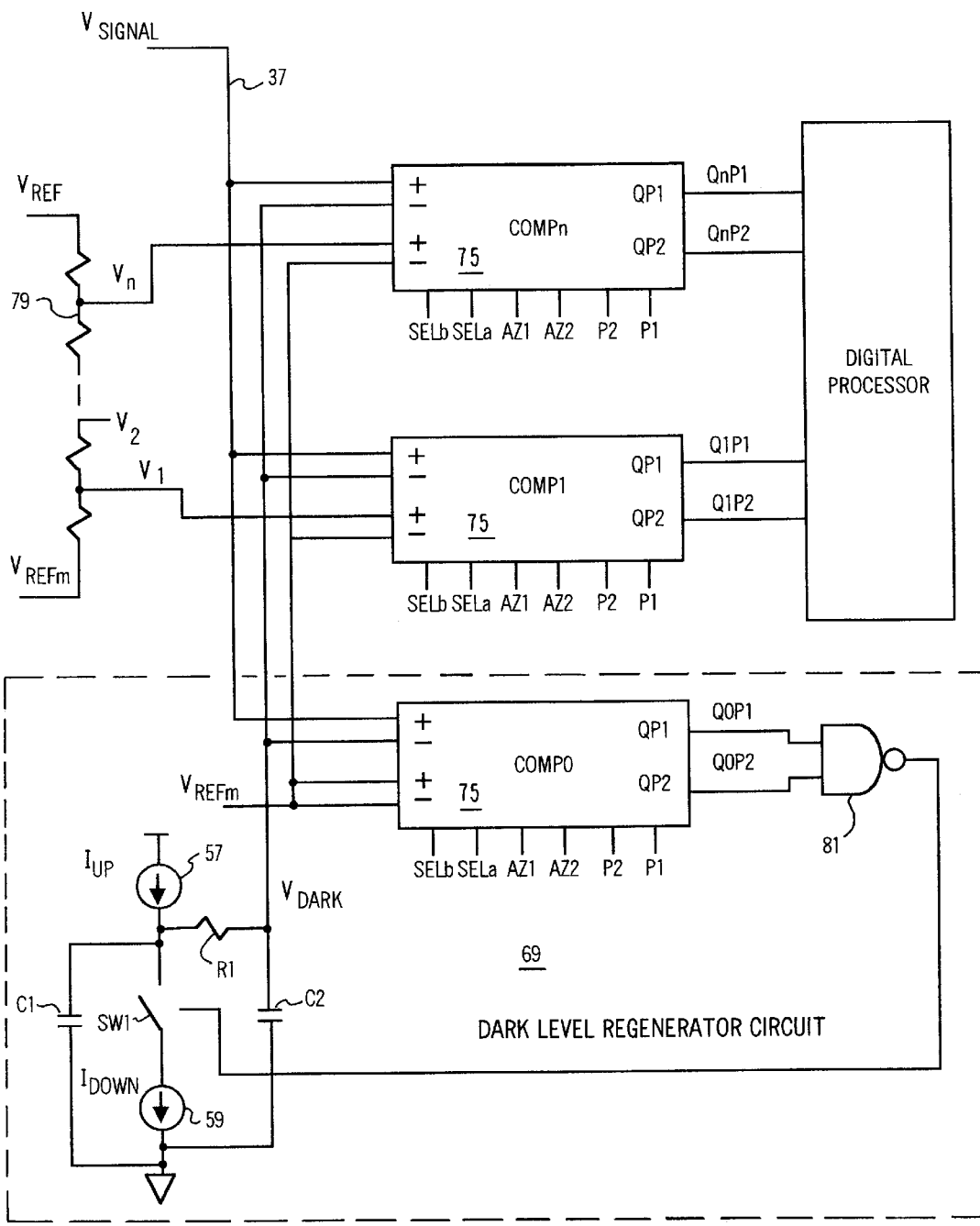
FIG. 4 is a block diagram according to the invention.
Figure 5:
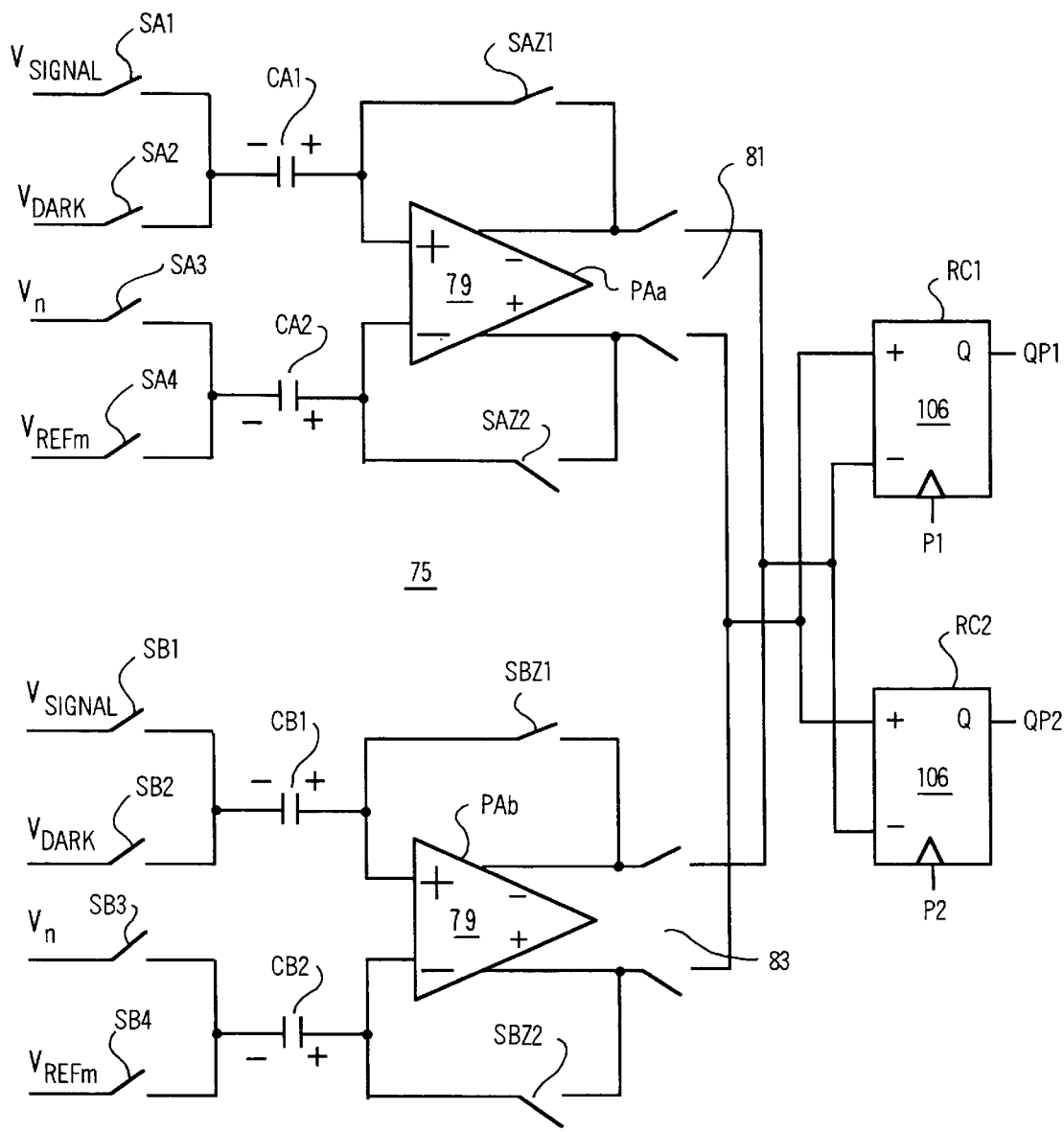
FIG. 5 is a schematic diagram of the comparator of FIG. 4.
Figure 6:
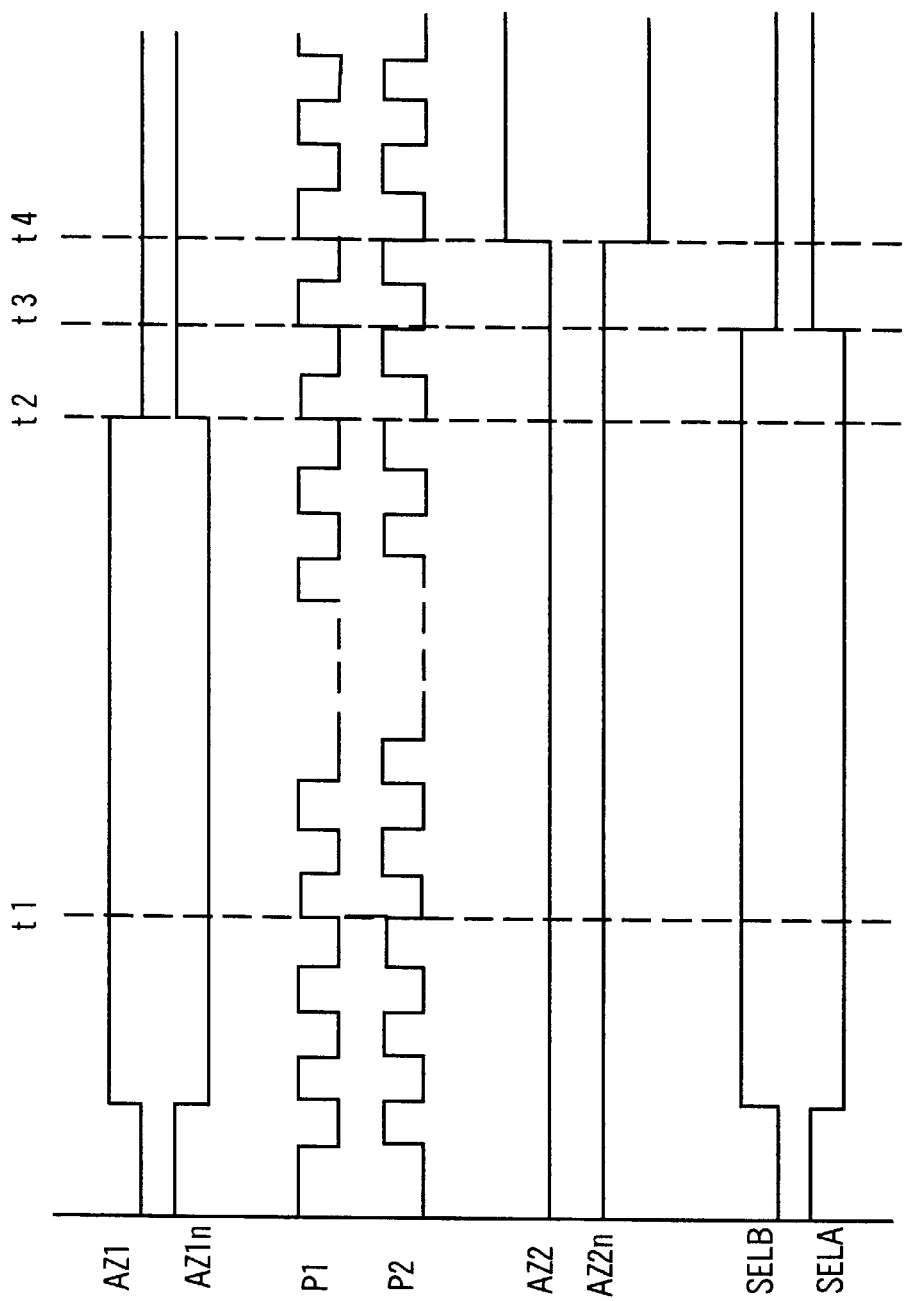
FIG. 6 is a timing diagram of the clock and control signals associated with the present invention.

FIGS. 5 and 6 should be used in conjunction with FIG. 4 which illustrates the details of each comparator 75 that are used for comparators COMP0 to COMPn. It comprises a fully differential preamplifier PAa and preamplifier PAb which are connected in parallel. The differential outputs of the preamplifiers PAa and PAb are connected through switch pairs 81 and 83 to a pair of Regenerative Comparators (RC) RC1 and RC2. RC1 is clocked by clock phase P1 and RC2 is clocked on clock phase P2. The inputs to the preamplifiers are connected through capacitors CA1, CA2, CB1 and CB2 to the voltage inputs $V_{SIGNAL}$, $V_{DARK}$, $V_n$, and $V_{REFm}$ via switches SA1, SA2, SA3, SA4, SB1, SB2, SB3, SB4. Switches SAZ1 to SBZ2 connect the preamplifier outputs to the inputs as shown and are used during an autozero operation.

When waveform AZ1 (FIG. 6) is at logic one, it represents the period of time that the following switches are closed: SA2, SA4, SAZ1 and SAZ2. When waveform AZ1n is at logic one, it represents the period of time that switches SA1 and SA3 are closed. When waveform AZ2 is at logic one, it represents the period of time that switches SB2, SB4, SBZ1 and SBZ2 are closed. When waveform AZ2n is at logic one, it represents the period of time that switches SB1 and SB3 are closed. Waveforms SELA and SELB, when at logic one state, represent the period of time that switches 81 and 83 respectively are closed.

FIG. 6 is a timing diagram of a typical operating sequence for the comparator 75. The operation of the comparator 75 of FIG. 5 is as follows:

First consider the situation at time t1 when differential preamplifier PAa is in autozero mode and differential preamplifier PAb is operating. During this time, the output of differential preamplifier PAb is connected through switches 83 to the inputs of RC1 and RC2. RC1 and RC2 are clocked by clock phases P1 and P2 respectively; their outputs QP1 and QP2 indicate the state of the output of differential preamplifier PAb on the rising edges of clocks P1 and P2. As mentioned earlier, at time t1 differential preamplifier PAa is in autozero mode. In this state, its outputs are connected through switches SAZ1 and SAZ2 to its complimentary inputs (i.e. it is connected in a negative feedback unity gain configuration). The positive terminals of capacitors CA1 and CA2 are therefore charged to the common mode voltage of the preamplifier PAa output. If the preamplifier has an offset voltage, this offset appears as a small differential voltage between the positive and negative inputs. In this fashion, the effect of a preamplifier offset voltage is attenuated by the open loop gain of the preamplifier. The negative side of CA1 and CA2 are charged to $V_{DARK}$ and $V_{REFm}$ through switches SA2 and SA4 respectively during this time. Now consider what happens at time t2 when the autozero cycle for differential preamplifier PAa ends as indicated by the falling edge of AZ1 and the rising edge of AZ1n. At this time, the negative plates of capacitors CA1 and CA2 are disconnected from $V_{DARK}$ and $V_{REFm}$ and subsequently on the rising edge of P1, SA1 closes and connects $V_{SIGNAL}$ to the negative of capacitor CA1 and switch SAB closes connecting Vn to the negative side of capacitor CA2. The feedback switches SAZ1 and SAZ2 are opened at the same time releasing differential preamplifier PAa from a unity gain configuration and allowing it to operate as an open loop amplifier. The voltage on the positive input to differential preamplifier PAa sees a resultant voltage change which is proportional to the quantity ($V_{SIGNAL}-V_{DARK}$) and the negative input to differential preamplifier PAa sees a resultant voltage change proportional to the quantity ($V_{in}-V_{REFm}$). It should be noted that these quantities now represent differences; absolute voltage levels are unimportant. Hence the $V_{REFm}$ to $V_n$ voltage range can be referenced to ground or any other convenient voltage level. The differential preamplifier PAa output now amplifies the quantity ($V_{SIGNAL}-V_{DARK}-V_n+V_{REFm}$). Thus, $V_{OUT}$ is given by:

$$V_{OUT}=K(V_{SIGNAL}-V_{DARK}-V_n+V_{REFm});$$

where K is effective preamplifier gain referred to the negative side of capacitors CA1, CA2, CB1 and CB2. Rewriting $V_{SIGNAL}-V_{DARK}$ as $dV_{SIGNAL}$ and $V_n-V_{REFm}$ as $V_{REFn}$ we have:

$$V_{OUT}=K(dV_{SIGNAL}-V_{REFn}).$$

Therefore, the preamplifier amplifies the difference between the time dependent amplitude of the input signal (with respect to its minimum or $V_{DARK}$ level) and a reference level $V_{REFn}$ defined as the difference between two other levels. It will be clear to those skilled in the art that these reference levels can be generated by a resistor ladder referenced to ground potential as an example.

At times t2 and t3 both differential preamplifier PAa and differential preamplifier PAb provide output signals which are identical, responsive to the input signal $V_{SIGNAL}$. At time t3, the output of differential preamplifier PAb is disconnected from the input to the regenerative comparators RC1 and RC2 and the output of differential preamplifier PAa is connected instead. Differential preamplifier PAb then goes through an identical autozero cycle on the rising edge of P1 (time t4) to close the switches identified for waveform AZ2.

The reasons for alternating the autozero cycles of differential preamplifier PAa and differential preamplifier PAb are as follows:

1. All switched capacitor circuits need regular recharging of the capacitors to nullify the effects of leakage. Consequently, to allow the analog to digital converter to operate continuously, two preamplifiers which autozero alternatively are required.

2. Having both differential preamplifier PAa and differential preamplifier PAb operate in parallel between t2 and t3 minimizes the disruption to the amplified signal presented to RC1 and RC2 at the crossover time t3. This means that the data stream available to subsequent processing circuitry on the outputs QP1 and QP2 (FIG. 5) is uninterrupted.

Referring to FIG. 4, the comparator COMP0 to comparator COMPn are shown using a two phase clock P1 and P2 to strobe the regenerative comparators. The reference levels $V_1$ to $V_n$ are generated by a resistor string 79 referenced to $V_{REFm}$. It will be clear that one value of $V_{REFm}$ that can be used is ground.

The outputs of comparators COMP1 to COMPn indicate whether $V_{SIGNAL}$ is above or below $V_1$ to $V_n$ respectively as sampled by clock phases P1 and P2. The outputs of the comparators are valid for one full clock cycle.

The comparator outputs can subsequently be processed by a standard flash analog to digital converter back-end decoder or by some other means.

The operation of the dark level recovery circuit 69 is very similar to that described in the illustrative embodiment of FIG. 3. Similar to the description of the comparator operation above, there are two comparator outputs each responsive to clock phases P1 and P2. The outputs of comparator COMP0 QOP1 and QOP2 are combined in a NAND gate 81 whose output is provided as the drive voltage for switch SW1.

Consider the situation where $V_{SIGNAL}$ is instantaneously greater than the regenerated dark level, $V_{DARK}$. In this case the comparator COMP0 outputs will be logic high when strobed by clock phases P1 and P2. The outputs of the comparator COMP0 are combined by the NAND gate 81. The output of the NAND gate 81 will be low which results in switch SW1 opening. In this case, the voltage on capacitor C1 increases slowly as it is charged by current IUP.

Consider now what happens if $V_{SIGNAL}$ is instantaneously below $V_{DARK}$. If this occurs when one or both of the regenerative comparators RC1 and RC2 are strobed, one or both comparator outputs will be low, switching the NAND gate 81 output to logic high. This closes switch SW1 which connects the current IDOWN to capacitor C1 thereby causing it to discharge. If current IDOWN is substantially larger than current IUP, the resultant voltage on capacitor C1 will exhibit a sawtooth waveform pattern centered on the true dark level of $V_{SIGNAL}$. This voltage can additionally be low pass filtered using the resistor R1, and capacitor C2 filter. The output of this filter is provided as the $V_{DARK}$ signal to comparators COMP0, COMP1 and COMPN.

Figure 7:
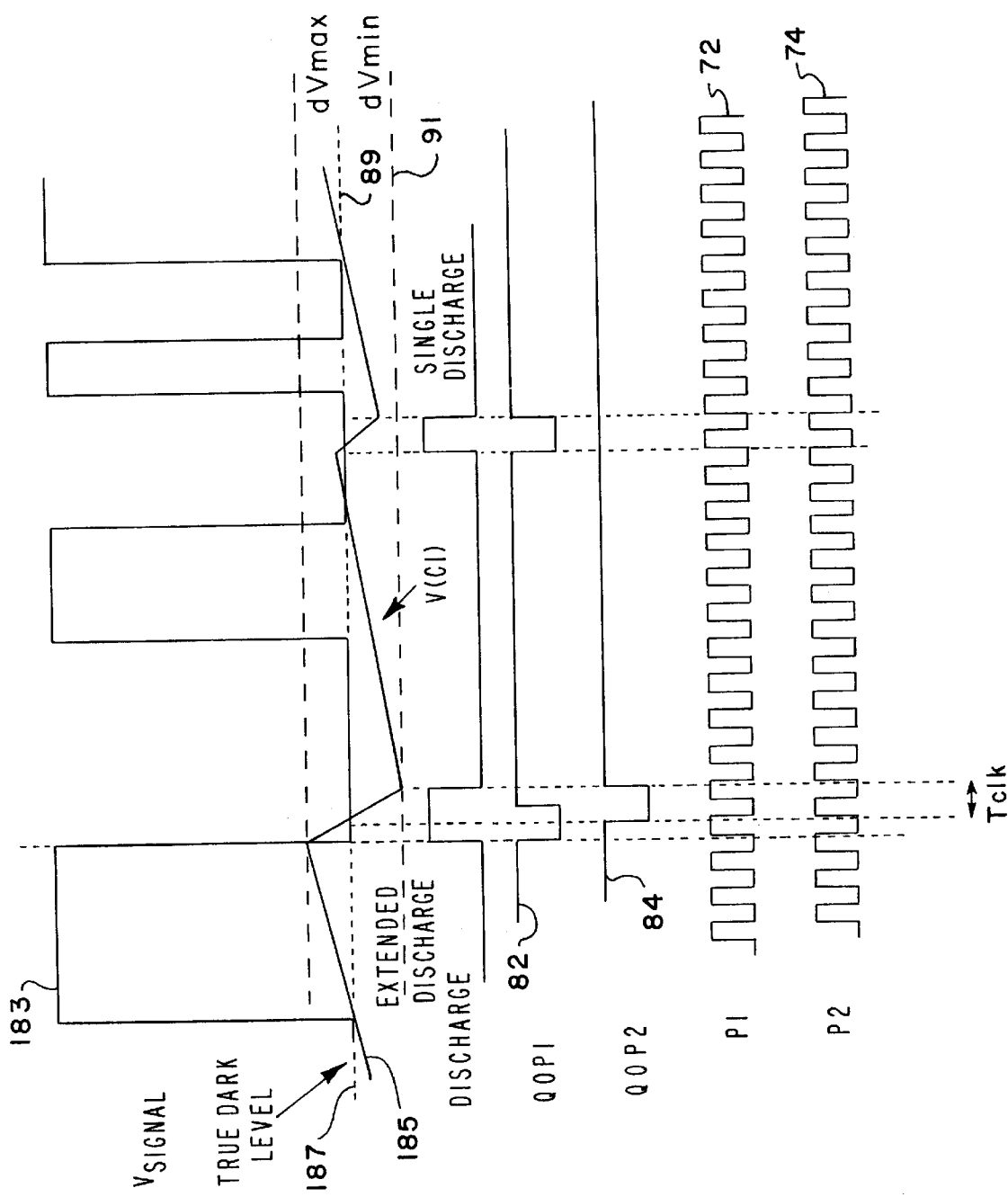
FIG. 7 is a timing diagram for the dark detector of FIG. 4.

FIG. 7 is a timing diagram of the high speed analog to digital converter such as that of FIG. 4 which is used as a dark detector. The timing diagram illustrates the flash analog to digital converter as it responds to a typical input data stream. $V_{SIGNAL}$ 183 is shown containing logic ones and zeros having variable time periods. For illustration purposes, the filter comprising resistor R1 and capacitor C2 is assumed to be removed from the circuit. The $V_{DARK}$ signal level represented by waveform 185 and presented to comparator COMP0 is now the voltage that appears on capacitor C1. The waveforms 185 illustrates the case where $V_{DARK}$ is close to the true dark level represented by waveform 187 of the signal.

Clock phases P1 (waveform 72) and P2 (waveform 74), each a full bit position long but phase shifted by 180 degrees, are used to strobe the dual regenerative comparators RC1 and RC2. The output QOP1 (waveform 82) and QOP2 (waveform 84) are the outputs of comparator COMP0 responsive to the rising edge of P1 and P2 respectively. The resultant voltage on C1 is a sawtooth waveform caused by the fact that current IUP is smaller than current IDOWN and that current IDOWN is switched on responsive only to the state of the outputs of comparator COMP0.

The magnitude of the deviations of the voltage on capacitor C1 from the true dark level dVmax dotted line 89 and dVmin dotted line 91 are a function of the capacitor size C1, current IUP, current IDOWN, the period of the clock and the maximum number of successive logic ones that can occur in the bitstream. (For clock recovery reasons, most coding schemes limit the number of successive ones or zeros in a serial bit stream 183).

The following equations describe the relationships:

$$\left[\Delta V_{max} = T_{max1} \cdot \frac{I_{UP}}{C1}\right]$$

$$\left[\Delta V_{min} = T_{clk} \cdot \frac{I_{DOWN}}{C1}\right]$$

If the filter comprising resistor R1 and capacitor C2 is now reinserted in the circuit, the effective deviations of $V_{DARK}$ as presented to the input of comparator COMP0 from the true dark level can be reduced to a very small number of millivolts. It will be clear that the time constant of this filter should be set at several tens of clock periods at minimum. Given the high clock rates that this circuit will operate at, this filter can be implemented on an integrated circuit easily. Finally, it will be clear that the implementation of the $V_{DARK}$ regeneration function provides essentially a "trough" or "valley" hold function in that the circuits locks to a value representing the minimum value of $V_{SIGNAL}$. Clearly, with very minor modifications, the circuit could be reconfigured to regenerate a peak value as long as the value of successive peaks varies with a much longer time constant than the clock rate.

Figure 8:
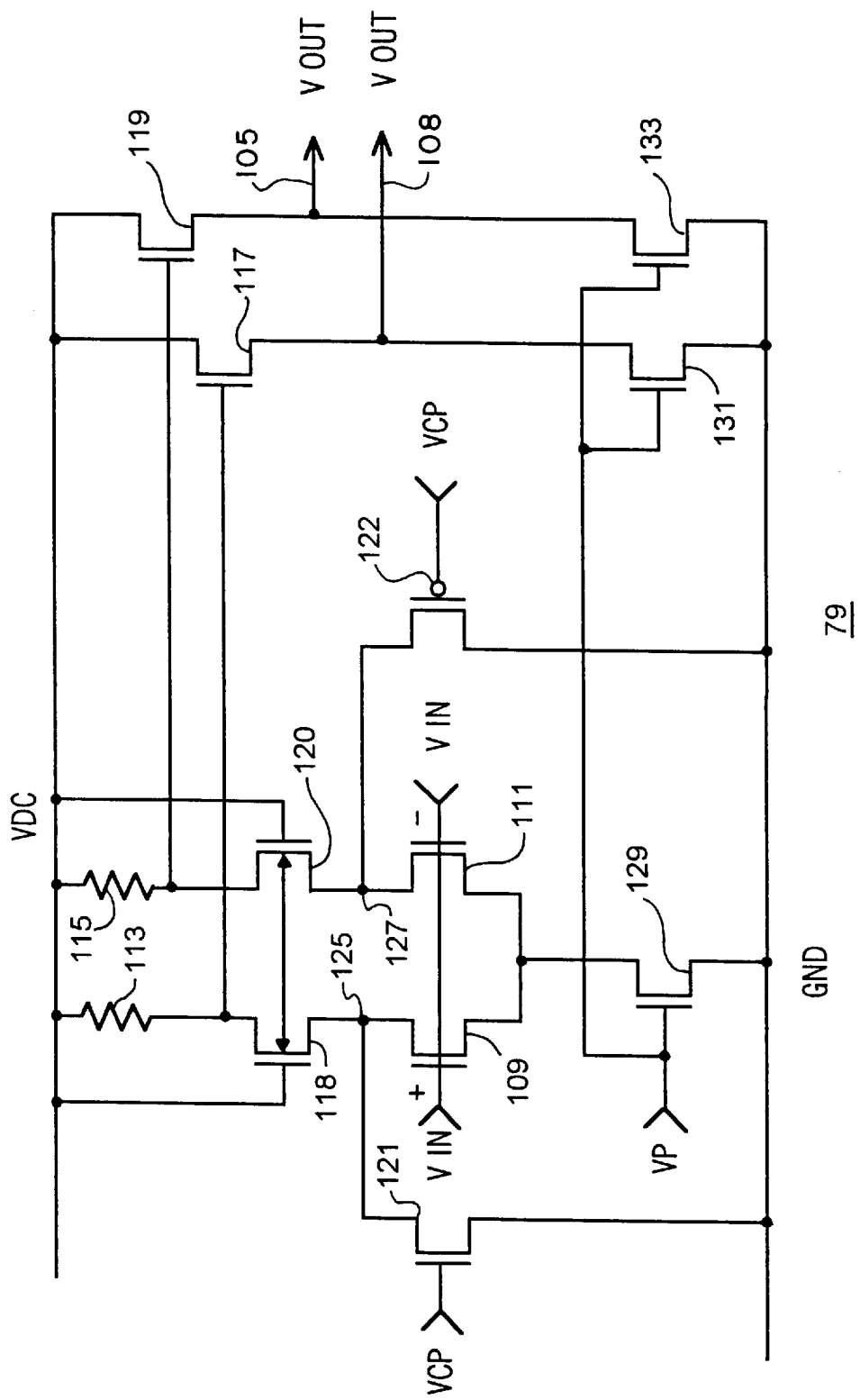
FIG. 8 is a schematic diagram of the preamplifier of FIG. 5.

FIG. 8 is a schematic diagram of the preamplifier 79. The preamplifier 79 provides two functions:

1. It provides some front end gain to the signal.
2. It dissipates any "kickback" effects that can occur when the second stage regenerative comparator (RC) switches from one logic level to another.

The preamplifier 79 has two inputs, a positive input $V_{in}+$ and a negative input $V_{in}-$ and two outputs, $V_{OUT+}$ and $V_{OUT-}$. A differential pair of transistors, 109 and 111 are provided with bias current by current source 129. The differential transistors are resistively loaded by resistors 113, 115. N-channel transistors 118 and 120 located between the resistor loads and the differential transistors operate as cascodes which keep the drains of the differential transistors 109 and 111 at a relatively fixed potential (independent of the small signal) and hence the time constant of the system is dominated by the resistor values and the capacitance seen at the inputs of n-channel followers, transistors 117 and 119. Transistors 117 and 119 buffer the resistive gain node from the output load and reduce any capacitative "kickback" that may occur when successive regenerative stages switch.

Transistors 121 and 122 are biased such that if their sources 125 and 127 rise in voltage (caused by a saturation of the preamplifier), these transistors shunt the extra large signal current and hence prevent overload recovery delays when the large signal is removed.

Figure 9:
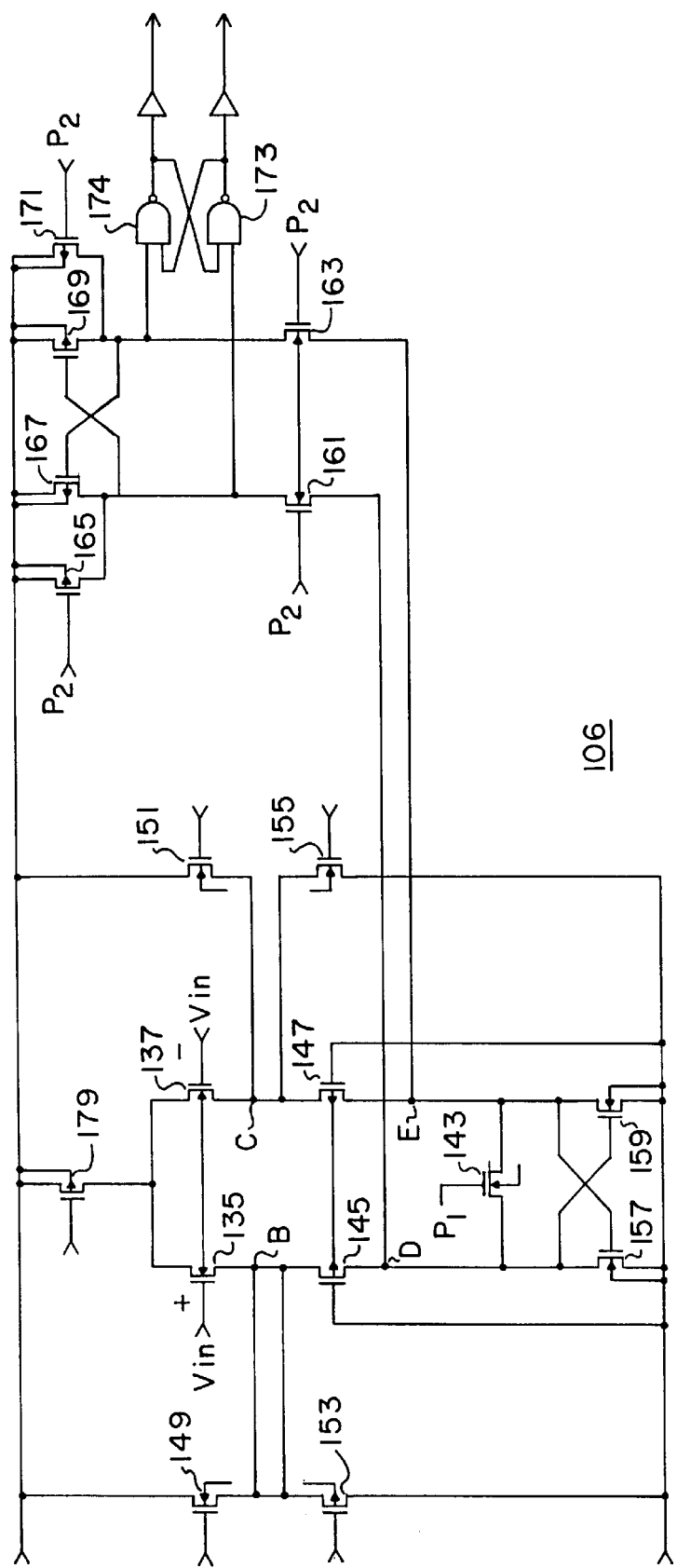
FIG. 9 is a schematic diagram of a regenerative comparator of FIG. 5.

FIG. 9, to which reference should now be made, is a schematic diagram of the regenerative comparator 106 of FIG. 5. The outputs 105 and 107 of FIG. 8 are applied to $V_{in}+$ and $V_{in}-$ 137 which are the gates for input transistors 135 to 137 respectively. The transistors 135 and 137 are differential pair transistors loaded by cross coupled n-channel transistor loads 157 and 159. P-channel transistors 145 and 147 act as cascodes which keep the drains of the input transistors relatively fixed. Switch 143 is responsive to clock phase P1 and resets the latch formed by transistor loads 159 and 157.

A second latching circuit is formed by nchannels transistors 161 and 163 and p-channel transistors 165, 167, 169, 171. This latch is responsive to clock phase P2.

Operation of the circuits is as follows:

Clock phases P1 and P2 are non overlapping clock phases. During P1, the switch 143 is closed and drives nodes D and E to approximately the same voltage. Depending on the polarity of the input voltage a small differential voltage is developed between these nodes. When clock phase P1 goes low and the switch is opened, this small initial differential voltage is amplified regeneratively causing a large signal responsive to the polarity of the input voltage to appear between nodes D and E.

After a short time interval, clock phase P2 is turned on. The p-channel transistors 165, 167, 169 and 171 latch switches in response to the polarity of the differential signal between D and E. The resulting logic change is subsequently captured by the SR latch formed by Nand gates 173 and 174.

N-channel transistors 149 and 151 and p-channel transistors 153 and 155 operate as limiters in the event that the comparator is subject to a large signal. They operate in such a way that any large signal curent is shunted to power or ground and hence nodes B and C so not saturate in either the positive or negative direction.

We claim:

1. A comparator circuit comprising:
   a first stage comparator for comparing an input signal to a first reference signal to obtain an output signal;
   reference generator means for generating the first reference signal;
   regenerator for comparing the input signal to a regenerated signal to obtain a control signal;
   means for generating the regenerated signal in response to the control signal, the regenerated signal being operatively connected to the regenerator and, wherein the reference generator means is referenced to the regenerated signal.

2. The comparator according to claim 1 wherein the reference generator means generates a second reference signal different from the first reference signal and the comparator circuit further comprises: a second stage comparator for comparing the second reference signal to the input signal to obtain a second output signal.

3. The comparator according to claim 2 further comprising a decoder operatively connected to provide a decoded output of the first and second output signals.

4. The comparator according to claim 3 wherein the means for generating the regenerated signal comprises:
   a capacitor;
   a current source operatively connected to the capacitor;
   a current sink;
   a switch having a first and second state and the state being controlled by the control signal, the switch being operatively connected between the current source and the current sink, and connected such that when in the first state the current source charges the capacitor and when in second state the current sink discharges the capacitor and whereby the voltage across the capacitor is the regenerated signal.

5. The comparator according to claim 4 further comprising: a decoder having N inputs and operatively connected to provide a decoded output of the first and N-1 output signals.

6. The comparator according to claim 2 wherein the decoder includes a first and second input register for sampling the first and second output signals at a predefined rate.

7. The comparator according to claim 1 wherein the reference generator generates a plurality of N reference signals wherein N is a positive number and each reference signal is different from any other reference signal and the comparator circuit further comprises: a plurality of N-1 stage comparators, each comparator being for comparing a member of the plurality of N-1 reference signal to the input signal to obtain an unique output signal, such that there are a total of N-1 output signals from the N-1 stage comparator.

8. The comparator according to claim 7 further including a baseline signal and the first stage comparator, and each of the N-1 stage comparators comprises:
   a first arithmetic means for obtaining the difference between the input signal and the regenerated signal to obtain an input signal prime, a second arithmetic means for obtaining the difference between a member of the plurality of N reference signals applied thereto and the base line signal to obtain a reference signal prime, a third arithmetic means having an operate state and a calibrate state and a fourth arithmetic means also having an operate state and a calibrate state whereby in the operate state each the third and fourth arithtnetic means obtains the difference between the input signal prime and the reference signal prime and when in the calibrate state each arithmetic means is calibrated; and
   timing means for controlling the time that the third and fourth arithmetic means are in the operate state and the calibrate state such that when the third arithmetic means is in the operate state the fourth arithmetic means is in the calibrate state and vice versa.

9. The comparator according to claim 8 wherein each of the first stage comparator and the N-1 stage comparators further comprises: a sampling means operatively connected to the third and fourth arithmetic means for sampling the difference between the input signal prime and the reference signal prime at a predetermined rate to provide a sampled output.

10. The comparator according to claim 8 wherein the regenerator further comprises;
   a fifth arithmetic means for obtaining the difference between the input signal and the regenerated signal to obtain an input signal prime,
   a circuit means for generating a null signal,
   a sixth arithmetic means having an operate state and a calibrate state, and a seventh arithmetic means also having an operate state and a calibrate state whereby in the operate state each the sixth and seventh arithmetic means obtains the difference between the input signal prime and the null signal and when in the calibrate state each arithmetic means is calibrated and whereby the timing means controls the time that the sixth and seventh arithmetic means are in the operate state and the calibrate state such that when the sixth arithmetic means is in the operate state the seventh arithmetic means is in the calibrate state and vice versa.

11. The comparator according to claim 10 wherein the regenerator further comprises a sampling means for sampling an output of the sixth arithmetic means and an output of the seventh arithmetic means to obtain a first and second sampled control signal thereby.

12. The comparator according to claim 11 wherein the regenerator further comprises a logic gate for combining the first and second sampled control signals to obtain the control signal.

13. The comparator according to claim 12 wherein the means for generating the regenerated signal comprises:
   a capacitor;
   a current source operatively connected to the capacitor;
   a current sink;
   a switch having a first and second state the state of which being controlled by the control signal, the switch being operatively connected between the current source and the current sink, and connected such that when in the first state the current source charges the capacitor and when in the second state the current sink discharges the capacitor and whereby the voltage across the capacitor is the regenerated signal.

14. The comparator according to claim 13 wherein the means for generating the regenerated signal further comprises a filter connected to the capacitor for filtering the regenerated signal.

15. An Analog to Digital Converter comprising:

a plurality of n parallel input comparators with each comparator being connected to receive an input signal and to convert it to a digital signal and wherein n is a positive number and each input comparator includes; a first arithmetic means for obtaining the difference between the input signal and a regenerated signal to obtain an input signal prime, a second arithmetic means for obtaining the difference between a member of the plurality of n reference signals applied thereto and a base line signal to obtain a reference signal prime, a third arithmetic means having a first and second input and a first and second output the third arithmetic means being for providing the difference between the input signal prime and the reference signal prime to obtain a first difference signal on the first and second outputs when in a first state and for connecting the input signal prime and the reference signal prime from the first and second inputs to the first and second outputs when in a second state, a fourth arithmetic means having a first and second input and a first and second output the fourth arithmetic means being for providing the difference between the input signal prime and the reference signal prime to obtain a second difference signal when the second arithmetic means is in a first state and for connecting the input signal prime and the reference signal prime from the first and second inputs to the first and second outputs when in a second state, sampling means for sampling the first and second difference signals and decoder means for decoding the first and second sampled difference signals to obtain an output signal;

means for generating a plurality of n reference signals with each reference signal having a different reference value than any other reference signal and greater than a baseline signal, the reference being connected to the plurality of n comparators such that for each comparator there is a single reference signal applied thereto;

regenerator means comprising; a fifth arithmetic means for obtaining the difference between the input signal and the regenerated signal to obtain an input signal prime, circuit means for obtaining a null signal, a sixth arithmetic means having a first and second input and a first and second output the sixth arithmetic means being for providing the difference between the input signal prime and the null signal to obtain a first difference signal on the first and second outputs when in a first state and for connecting the input signal prime and the null signal from the first and second inputs to the first and second outputs when in a second state, a seventh arithmetic means having a first and second input and a first and second output the second arithmetic means being for providing the difference between the input signal prime and the null signal to obtain a second difference signal when the seventh arithmetic means is in a first state and for connecting the input signls prime and the baseline signal from the first and second inputs to the first and second outputs when in a second state, sampling means for sampling the first and second difference signals at a predefined sampling rate, and combining means for combining the first and second sampled differences signals to obtain a control signal; and regenerated signal generator means for generating the regenerated signal in response to the control signal, the regenerated signal being operatively connected to each of the plurality of n comparators and regenerator.

16. The Analog to Digital Converter according to claim 15 further comprising:

clock means for providing a first clock signal and a second clock signal that is not at the phase of the first clock signal being applied to control the states of each of the third and fourth arithmetic means of the plurality of n comparators and the sixth and arithmetic means such that when the sixth and each third arithmetic means are in the first state the seventh and each fourth arithmetic means are in the second state and vice versa.

17. The Analog to Digital Converter according to claim 15 wherein the regenerated signal generator means comprises:

a capacitor;

a current source operatively connected to the capacitor;

a current sink;

a switch having a first and second state, the state of which being controlled by the control signal, the switch being operatively connected between the current source and the current sink, and connected such that when in the first state the current source charges the capacitor and when in the second state the current sink discharges the capacitor and whereby the voltage across the capacitor is the regenerated signal.

18. The Analog to Digital Converter according to claim 17 further comprising a filter connected to the capacitor for filtering of the regenerated signal.

19. A method of converting an Analog signal to a Digital signal comprising the steps of:

generating a first reference signal from a generated signal;

comparing an input signal to the first refrience signal to obtain a first output signal with a first stage comparator;

comparing the input signal to the regenerated signal to obtain a control signal with a regenerator comparator; and generating the regenerated signal in response to the control signal.

20. The method according to claim 19 wherein the step of generating a first reference signal comprises the step maintaining a set difference in magnitude between the regenerated signal and the first reference signal.

21. The method according to claim 20 further comprising the steps of: generating a second reference signal different from the first reference signal and comparing the second reference signal to the input signal to obtain a second output signal.

22. The method according to claim 21 further comprising the steps of decoding the first and second output signals.

23. The method according to claim 21 wherein the step of generating the regenerated signal comprises:

setting a switch to a first position and a second position with the control signal;

storing a current on a capacitor when the switch is in the first position; and discharging the capacitor when the switch is in the second position.

24. The method according to claim 19 further comprising the steps of: generating a plurality of N reference signals wherein N is a positive number and each reference signal is different from any other reference signal; and comparing with a plurality of N−1 stage comparators a member of the plurality of N−1 reference signal to the input signal to obtain an unique output signal, such that there are N−1 output signals.

25. The method according to claim 24 further comprising the steps of sampling and decoding the first and the N−1 output signals.

26. The method according to claim 25 wherein the first stage comparator and each of the N−1 stage comparators each include:

a first and second arithmetic means and a third arithmetic means having an operate state and a calibrate state and a fourth arithmetic means also having an operate state and a calibrate state, the method further comprises;

obtaining the difference between the input signal and the common signal to obtain an input signal prime with the first arithmetic means;

obtaining the difference between a member of the n plurality of reference signals applied thereto and a baseline signal to obtain a reference signal prime with the second arithmetic means, when each the third and fourth arithmetic means are in the operate state, and the difference between the input signal prime and reference signal prime and when in the calibrate state calibrating each arithmetic means; and controlling the time that the third and fourth arithmetic means are in the operate state and the calibrate state such that when the third arithmetic means is in the operate state the fourth arithmetic means is in the calibrate state and vice versa.

27. The method according to claim 26 wherein the step of generating the common signal further comprises:

obtaining the difference between the input signal and the common signal to obtain an input signal prime;

generating a null signal from the baseline signal; and obtaining the difference between the input signal and the null signal means to obtain the control signal thereby.

28. The method of claim 27 wherein the step of generating the common signal comprises:

setting a switch to a first position and a second position with the control signal;

storing a current on a capacitor when the switch is in the first position; and discharging the capacitor when the switch is in the second.

* * * * *